(12) United States Patent
Lau et al.

(10) Patent No.: US 8,604,603 B2
(45) Date of Patent: Dec. 10, 2013

(54) APPARATUS HAVING THERMAL-ENHANCED AND COST-EFFECTIVE 3D IC INTEGRATION STRUCTURE WITH THROUGH SILICON VIA INTERPOSERS

(75) Inventors: Hon Shing Lau, Palo Alto, CA (US); Shi-Wei Lee, Hong Kong (CN); Matthew Ming Fai Yuen, Hong Kong (CN); Jingshen Wu, Hong Kong (CN); Chi Chuen Lo, Hong Kong (CN); Haibo Fan, Hong Kong (CN); Haibin Chen, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 188 days.

(21) Appl. No.: 12/709,291

(22) Filed: Feb. 19, 2010

(65) Prior Publication Data
US 2010/0213600 A1 Aug. 26, 2010

Related U.S. Application Data

(60) Provisional application No. 61/202,347, filed on Feb. 20, 2009.

(51) Int. Cl.
*H01L 29/72* (2006.01)
(52) U.S. Cl.
USPC ............ 257/693; 257/686; 257/698; 257/713; 257/E23.08; 257/E23.69; 257/E21.506; 438/122; 439/330
(58) Field of Classification Search
USPC .................... 257/686, 693, 698, 713, E23.08, 257/E23.69, E21.506; 438/122; 439/330
See application file for complete search history.

(56) References Cited

U.S. PATENT DOCUMENTS

| | | | |
|---|---|---|---|
| 5,054,872 | A | 10/1991 | Fan et al. |
| 6,057,601 | A | 5/2000 | Lau et al. |
| 6,243,509 | B1 | 6/2001 | Chen |
| 6,456,766 | B1 | 9/2002 | Shaw et al. |
| 6,846,725 | B2 | 1/2005 | Nagarajan et al. |
| 6,907,151 | B2 | 6/2005 | Yunus |

(Continued)

OTHER PUBLICATIONS

Andry et al., "Fabrication and characterization of robust through-silicon vias for silicon-carrier applications," IBM J. Res. & Dev., 52 (6): 571-581 (Nov. 2008).

(Continued)

*Primary Examiner* — Edward Wojciechowicz
(74) *Attorney, Agent, or Firm* — Leydig, Voit & Mayer, Ltd.

(57) ABSTRACT

An apparatus having a three-dimensional integrated circuit structure is described herein. The apparatus include an interposer for carrying a plurality of high and low-power chips. The high-power chips are attached and connected to one side of the interposer, while the low-power chips are attached and connected to the other side of the interposer. In generally, the high-power chips produce more heat than does the low-power chip during their operations. The interposer further include through silicon vias and redistribution layers for connecting the chips on both surfaces. In addition, the interposer assembly is attached and connected to a substrate layer, which is in turn attached and connected to a printed circuit board. In order to provide improve thermal management, the interposer surface carrying the high-power chips are oriented away from the circuit board. A heat spreader is attached to the back sides of the high-power chips for dissipating the heat.

13 Claims, 13 Drawing Sheets

(56) References Cited

U.S. PATENT DOCUMENTS

| | | | |
|---|---|---|---|
| 6,924,551 | B2 | 8/2005 | Rumer et al. |
| 7,263,248 | B2 | 8/2007 | Windover |
| 7,317,256 | B2 | 1/2008 | Williams et al. |
| 7,373,033 | B2 | 5/2008 | Lu et al. |
| 2005/0089264 | A1 | 4/2005 | Johnson et al. |
| 2006/0009029 | A1 | 1/2006 | Hua et al. |
| 2006/0046432 | A1 | 3/2006 | Sankarapillai et al. |
| 2008/0006934 | A1* | 1/2008 | Zhao et al. ............. 257/713 |
| 2009/0032928 | A1 | 2/2009 | Chiang et al. |
| 2009/0325415 | A1* | 12/2009 | Brist et al. ............. 439/330 |
| 2010/0078789 | A1* | 4/2010 | Choi et al. ............. 257/686 |
| 2010/0285637 | A1* | 11/2010 | Khan et al. ............. 438/122 |

OTHER PUBLICATIONS

Chai et al., "Electrical interconnect design optimization for fully embedded board-level optical interconnects," IEEE 2008 Electronic Components and Technology Conference (ECTC 2008), 1-5 (May 27-30, 2008).

Chang et al., "Fabrication of fully embedded board-level optical interconnects and optoelectronic printed circuit boards," IEEE 2009 11th Electronics Packaging Technology Conference (2009 EPTC), 1-4 (Dec. 9-11, 2009).

Chen et al., "C2W bonding method for MEMS applications," IEEE 2008 10th Electronics Packaging Technology Conference (2008 EPTC), 1283-1287 (Dec. 9-12, 2008).

Choi et al., "Development of low temperature bonding using in-based solders," IEEE 2008 Electronic Components and Technology Conference (2008 ECTC), 1294-1299 (May 27-30, 2008).

Choi et al., "Development of novel intermetallic joints using thin film indium based solder by low temperature bonding technology for 3D IC stacking," IEEE 2009 Electronic Components and Technology Conference (ECTC 2009), 333-338 (May 26-29, 2009).

Doany et al., "300-Gb/s 24-channel bidirectional Si carrier transceiver optochip for board-level interconnects," IEEE 2008 Electronic Components and Technology Conference (2008 ECTC), 238-243 (May 27-30, 2008).

Ho et al., "High RF performance TSV silicon carrier for high frequency application," IEEE 2008 Electronic Components and Technology Conference (2008 ECTC), 1946-1952 (May 27-30, 2008).

Ishii et al., "SMT-compatible large-tolerance 'OptoBump' interface for interchip optical interconnections," IEEE Transactions on Advanced Packaging, 26 (2): 122-127 (May 2003).

Khan et al., "3D Packaging with Through Silicon Via (TSV) for electrical and fluidic interconnections," IEEE 2009 Electronic Components and Technology Conference (ECTC 2009), 1153-1158 (May 26-29, 2009).

Khong et al., "A novel method to predict die shift during compression molding in embedded wafer level package," IEEE 2009 Electronic Components and Technology Conference (ECTC 2009), 535-541 (May 26-29, 2009).

Kumar et al., "Evaluation of stresses in thin device wafer using piezoresistive stress sensor," IEEE 2008 10th Electronics Packaging Technology Conference (2008 EPTC), 1270-1276 (Dec. 9-12, 2008).

Kumar et al., "Wafer level embedding technology for 3D wafer level embedded package," IEEE 2009 Electronic Components and Technology Conference (ECTC 2009), 1289-1296 (May 26-29, 2009).

Lau et al., "Design and analysis of 3D stacked optoelectronics on optical printed circuit boards," Photonics Packaging, Integration, and Interconnects VIII (Glebov et al., eds.), Proceedings vol. 6899 (Feb. 8, 2008).

Lau et al., "Failure analyses of 3D SiP (System-in-Package) and WLP (Wafer-Level Package) by finite element methods," 16th IEEE International Symposium on the Physical and Failure Analysis of Integrated Circuits (IPFA 2009), 1-8 (Jul. 6-10, 2009).

Lau et al., "Thermal management of 3D IC integration with TSV (Through Silicon Via," IEEE 2009 Electronic Components and Technology Conference (ECTC 2009), 633-640 (May 26-29, 2009).

Lee et al., "Bonding interface materials evolution of intermediate In/AG layers for low temperature fluxless solder based MEMS wafer level packaging," IEEE 2008 International Conference on Electronic Materials and Packaging (2008 EMAP), 216-219 (Oct. 22-24, 2008).

Liang et al., "Fabrication and optimization of the 45° micro-mirrors for 3-D optical interconnections," IEEE 2008 10th Electronics Packaging Technology Conference (2008 EPTC), 1-6 (Dec. 9-12, 2008).

Lim et al., "Demonstration of high frequency data link on FR4 Printed Circuit Board using optical waveguides," IEEE 2008 Electronic Components and Technology Conference (2008 ECTC) (May 27-30, 2008).

Lim et al., "Demonstration of high quality and low loss millimeter wave passives on embedded wafer level packaging platform (EMWLP)," IEEE 2009 Electronic Components and Technology Conference (ECTC 2009), 508-512 (May 26-29, 2009).

Lim et al., "Process development and reliability of microbumps," IEEE 2008 10th Electronics Packaging Technology Conference (2008 EPTC), 367-372 (Dec. 9-12, 2008).

Premachandran et al., "A novel, wafer-level stacking method for low-chip yield and non-uniform, chip-size wafers for MEMS and 3D SIP applications," IEEE 2008 Electronic Components and Technology Conference (2008 ECTC), 314-318 (May 27-30, 2008).

Premachandran et al., "Influence of optical probe packaging on a 3D MEMS scanning micro-mirror for optical coherence tomography (OCT) applications," IEEE 2008 Electronic Components and Technology Conference (2008 ECTC), 829-833 (May 27-30, 2008).

Ramana et al., "Bi-directional Optical communication at 10 Gb/s on FR4 PCB using reflow solderable SMT transceiver," IEEE 2008 Electronic Components and Technology Conference (2008 ECTC), 1-7 (May 27-30, 2008).

Schares et al., "Terabus: terabit/second-class card-level optical interconnect technologies," IEEE Journal of Selected Topics in Quantum Electronics, 12 (5): 1032-1044 (Sep. 2006).

Sekhar et al., "Effect of wafer back grinding on the mechanical behavior of multilayered low-k for 3D-stack packaging applications," IEEE 2008 Electronic Components and Technology Conference (2008 ECTC), 1517-1524 (May 27-30, 2008).

Selvanayagam et al., "Nonlinear thermal stress/strain analyses of copper filled TSV (through silicon via) and their flip-chip microbumps," IEEE 2008 Electronic Components and Technology Conference, 1073-1081 (May 27-30, 2008).

Sharma et al., "Embedded wafer level packages with laterally placed and vertically stacked thin dies," IEEE 2009 Electronic Components and Technology Conference (ECTC 2009), 1537-1543 (May 26-29, 2009).

Shiah et al., "Optimization and characterization of flexible polymeric optical waveguide fabrication process for fully embedded board-level optical interconnects," IEEE 2008 10th Electronics Packaging Technology Conference (2008 EPTC), 1-7 (Dec. 9-12, 2008).

Tan et al., "Thermal and hydraulic design and characterization of a liquid-cooled 3D silicon module," IEEE 2008 10th Electronics Packaging Technology Conference (2008 EPTC), 350-354 (Dec. 9-12, 2008).

Tang et al., "Fluidic interconnects in integrated liquid cooling systems for 3-D stacked TSV modules," IEEE 2008 10th Electronics Packaging Technology Conference (2008 EPTC), 552-558 (Dec. 9-12, 2008).

Vempati et al., "Development of 3-D silicon die stacked package using flip chip technology with micro bump interconnects," IEEE 2009 Electronic Components and Technology Conference (ECTC 2009), 980-987 (May 26-29, 2009).

Yan et al., "A hermetic chip to chip bonding at low temperature with Cu/In/Sn/Cu joint," IEEE 2008 Electronic Components and Technology Conference (2008 ECTC), 1844-1848 (May 27-30, 2008).

Yu et al., "Development of fine pitch solder microbumps for 3D chip stacking," IEEE 2008 10th Electronics Packaging Technology Conference (2008 EPTC), 387-392 (Dec. 9-12, 2008).

Yu et al., "Electromigration study of 50 μm pitch micro solder bumps using four-point kelvin structure," IEEE 2009 Electronic Components and Technology Conference (ECTC 2009), 930-935 (May 26-29, 2009).

Yu et al., "Fabrication of silicon carriers with TSV electrical interconnections and embedded thermal solutions for high power 3-D packages," IEEE Transactions on Components and Packaging Technologies, 32 (3): 566-571 (Sep. 2009).

(56) References Cited

OTHER PUBLICATIONS

Yu et al., "Study of 15μm pitch solder microbumps for 3D IC integration," IEEE 2009 Electronic Components and Technology Conference (ECTC 2009), 6-10 (May 26-29, 2009).

Yu et al., "The role of Ni buffer layer between InSn Solder and Cu Metallization for hermetic wafer bonding," IEEE 2008 International Conference on Electronic Materials and Packaging (2008 EMAP), 171-174 (Oct. 22-24, 2008).

Yu et al., "Three dimensional interconnects with high aspect ratio TSVs and fine pitch solder microbumps," IEEE 2009 Electronic Components and Technology Conference (ECTC 2009), 350-354 (May 26-29, 2009).

Yu et al., "Wafer level hermetic bonding using Sn/In and Cu/Ti/Au metallization," IEEE 2008 10th Electronics Packaging Technology Conference (2008 EPTC), 767-772 (Dec. 9-12, 2008).

Yu et al., "Wafer-level hermetic bonding using Sn/In and Cu/Ti/Au metallization," IEEE Transactions on Components and Packaging Technologies, 32 (4): 926-934 (Dec. 2009).

Zhang et al., "Application of piezoresistive stress sensors in ultra thin device handling and characterization," Sensors and Actuators A: Physical, 156: 2-7 (2009).

Zhang et al., "Development of Through Silicon Via (TSV) interposer technology for large die (21x21mm) finepitch Cu/low-k FCBGA package," IEEE 2009 Electronic Components and Technology Conference (ECTC 2009), 305-312 (May 26-29, 2009).

Khan et al., "Development of 3D Silicon Module with TSV for System in Packaging," *IEEE Proceedings of Electronic, Components & Technology Conference (ECTC)*, 550-555 (Orlando, FL, USA, May 27-30, 2008).

Lau, J. H., and R. S. W. Lee, Microvias for Low Cost, High Density Interconnects, McGraw-Hill, New York, NY, 2001.

Lau, J. H., Ball Grid Array Technology, McGraw-Hill, New York, NY, 1995.

Lau, J. H., and K. L. Chen, "Thermal and Mechanical Evaluations of a Cost-Effective Plastic Ball Grid Array Package", ASME Transactions, Journal of Electronic Packaging, vol. 119, Sep. 1997, pp. 208-212.

Lau, J. H., and T. Chen, "Cooling Assessment and Distribution of Heat Dissipation of a Cavity Down Plastic Ball Grid Array Package—NuBGA", IMAPS Transactions, International Journal of Microelectronics & Electronic Packaging, vol. 21, No. 1, 1998, pp. 20-28.

Lau, J. H., and T. Chou, "Electrical Design of a Cost-Effective Thermal Enhanced Plastic Ball Grid Array Package—NuBGA", IEEE Transactions on CPMT, Part B, vol. 21, No. 1, Feb. 1998, pp. 35-42.

Lau, J. H., T. Chen, and R. Lee, "Effect of Heat Spreader Sizes on the Thermal Performance of Large Cavity-Down Plastic Ball Grid Array Packages", ASME Transactions, Journal of Electronic Packaging, vol. 121, No. 4, 1999, pp. 242-248.

Lau, J. H., "Design, Manufacturing, and Testing of a Novel Plastic Ball Grid Array Package", Journal of Electronics Manufacturing, vol. 9, No. 4, Dec. 1999, pp. 283-291.

Lau, J. H., and T. Chen, "Low-Cost Thermal and Electrical Enhanced Plastic Ball Grid Array Package—NuBGA", Microelectronics International, 1999.

Lau, J. H., "Solder Joint Reliability of Flip Chip and Plastic Ball Grid Array Assemblies Under Thermal, Mechanical, and Vibration Conditions", IEEE Transaction on CPMT, Part B, vol. 19, No. 4, pp. 728-735, Nov. 1996.

Lau, J. H., with R. Lee, "Design for Plastic Ball Grid Array Solder Joint Reliability", Circuit World, vol. 23, No. 2, Jan. 1997, pp. 11-13.

Lau, J. H., with W. Jung and Y. Pao, "Nonlinear Analysis of Full-Matrix and Perimeter Plastic Ball Grid Array Solder Joints", ASME Transactions, Journal of Electronic Packaging, vol. 119, Sep. 1997, pp. 163-170.

Lau, J. H., with R. Lee, "Solder Joint Reliability of Cavity-Down Plastic Ball Grid Array Assemblies", Journal of Soldering & Surface Mount Technology, vol. 10, No. 1, Feb. 1998, pp. 26-31.

Lim et al., "Demonstration of High Frequency Data Link on FR4 Printed Circuit Board using Optical Waveguides," *IEEE Proceedings of Electronic, Components & Technology Conference (ECTC)*, 1268-1274 (Las Vegas, NV, USA, May 29-Jun. 1, 2007).

Polka et al., "Package technology to address the memory bandwidth challenge for terascale computing," *Intel Technol. J.*, 11 (3): 197-206 (Aug. 22, 2007).

Yu et al., "Fabrication of Silicon Carriers with TSV Electrical Interconnections and Embedded Thermal Solutions for High Power 3-D Package," *IEEE Proceedings of Electronic, Components & Technology Conference (ECTC)*, 24-28 (Orlando, FL, USA, May 27-30, 2008).

\* cited by examiner

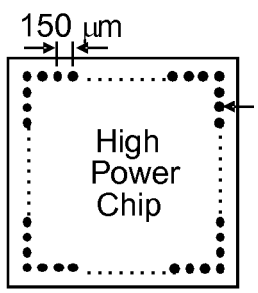 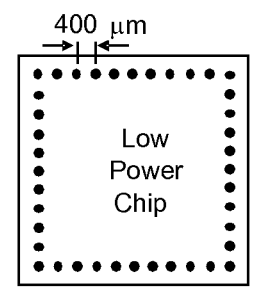
FIGURE 6A  FIGURE 6B

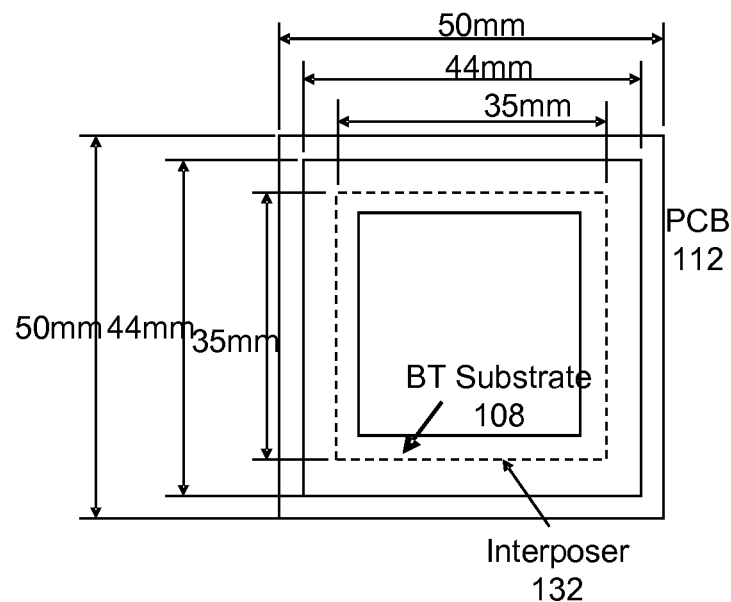
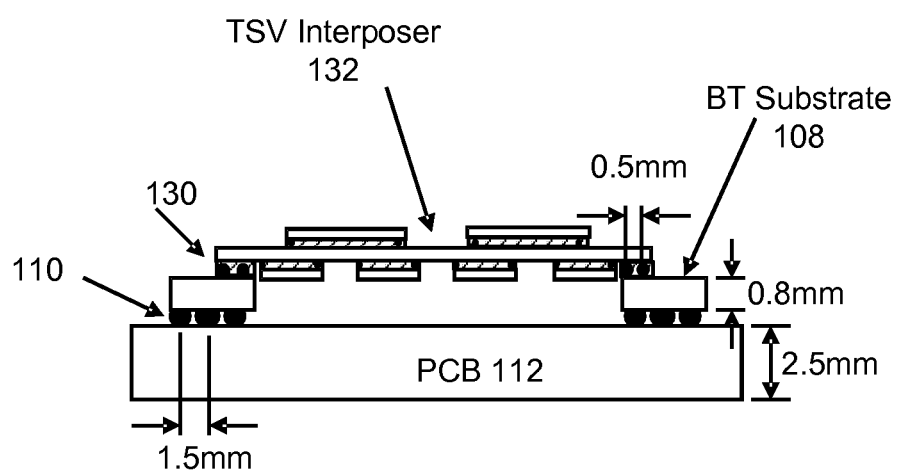
FIGURE 7A

APPARATUS HAVING THERMAL-ENHANCED AND COST-EFFECTIVE 3D IC INTEGRATION STRUCTURE WITH THROUGH SILICON VIA INTERPOSERS

CROSS-REFERENCE TO RELATED APPLICATION

This patent application claims the benefit of U.S. Provisional Patent Application No. 61/202,347, filed Feb. 20, 2009, which is incorporated by reference in its entirety.

TECHNICAL FIELD

The present invention relates in general to integrated circuit (IC) structures and in particular to a high-performance structural design for three-dimensional system in package (SiP) with improved thermal management.

BACKGROUND OF THE INVENTION

Moore's law has been the most powerful driver for the development of the microelectronic industry. This law emphasizes lithography scaling and conventional two-dimensional integration of all functions on a single chip, often called system-on-chip (SoC). On the other hand, the integration of all system components can be achieved through system-in-package (SiP) and, ultimately, through three-dimensional IC integration and packaging.

A system-in-a-package includes a number of integrated circuits enclosed in a single package or module. The SiP performs all or most of the functions of an electronic system, and is typically used inside a mobile phone, digital music player, etc. In a SiP, individual integrated circuits can be stacked vertically or arranged horizontally. They are internally connected by fine wires that are bonded to the package. Alternatively, with a flip-chip technology, solder bumps are used to join stacked chips together.

Another solution for improving the integration of the circuit component is three-dimensional integrated circuit (3D IC), which includes two or more layers of active electronic components integrated both vertically and horizontally into a single circuit. Unlike SiP, a 3D IC circuit connects stacked silicon dies with conductors, commonly called Through Silicon Vias (TSVs), running through the die. TSV plays a very important role in modern 3D IC integration and packaging. It can be used for stacking up a series of memory chips and provides a signal or heat path between the chips. Also, it can be used in an interposer or substrate to support fine-pitch, high-power, and high-density integrated circuit (IC) chips.

In "Fabrication and characterization of robust through-silicon vias for silicon-carrier applications," IBM Journal of Research and Development, Vol. 52,No. 6,pp. 571-581, 2008, Andry et al. laid open a schematic representation of die stacking with TSV and integrated passive functions. In there, the TSV carrier has back-end-of-line (BEOL) redistribution layers and its top-side is used to support the chips with micro-bumps. The bottom-side of the TSV interposer is attached to simple organic/ceramic substrates.

In "Development of Through Silicon Via (TSV) interposer technology for large die (21×21 mm) fine-pitch Cu/low-k FCBGA packet," in Proceedings of 59th Electronic Components and Technology Conference, pp. 305-312, 2009, Zhang et al. describes a high-performance 65 nm Cu/low-k large chip supported by and attached to the bottom side of a TSV interposer.

In U.S. Pat. No. 6,846,725, Nagarajan et al. laid open a scheme for micro-electro-mechanical system (MEMS) packaging with TSV. In there, the MEMS device on a silicon substrate is protected by a cap with TSV for vertical electrical feed-through. For 3D MEMS packaging, the TSV cap can be an ASIC chip with TSV.

As Moore predicted in 1965, silicon chips are getting larger while incorporating a higher pin count and finer pad pitch. Unfortunately, conventional substrates with build-up layers made up of organic materials, e.g., bismaleimide triazine (BT), are facing great challenges in supporting these high pin-count, fine-pitched silicon chips. Thus, to address these needs, silicon interposer with high-density TSV has emerged as a perfect solution to provide high wiring density redistribution and interconnection.

In conventional face-down plastic ball grid array (PBGA) packages, the chip is supported by the high-density BT-substrate with build-up layers. As the chip gets bigger with a higher pin count and finer pitch, the BT substrate can no longer support it. Hence there is a need for an intermediate substrate (e.g., the TSV interposer) to redistribute the large array of fine-pitch pads on the chip to fewer and relatively larger pitch pads on a simpler and thinner BT substrate even without any build-up layers. The foot-print of this TSV package is much smaller than those with high-density BT-substrate with build-up layers.

Generic 3D IC integration technology for high-performance computing systems provides TSVs in 3D chip stacks or in a chip carrier, thereby enabling the very high-power, high pin-count, and fine-pitch active components and memory chips stacked together in a 3D structure.

However, due to high density and high complexity of the circuit components, it is difficult to dispose TSV on the active circuit dies and wafers. In addition, the chip size and number of pin outs on the circuit components are unlikely the same. Therefore, forcing them together will reduce design flexibility and compromise the functionalities. In addition, electrical performance is usually compromised due to the longer routings in these circuits.

Another critical issue of 3D IC integrations is thermal management. In conventional 3D ICs, the 3D structure causes increased total power generation per unit substrate area. Individual chip in the 3D stack may be overheated if cooling is not properly and adequately provided, The space between individual chips in the 3D stack may be too small for providing cooling channels due to the fact that gaps are too small for fluid flows.

Finally and more importantly, the requirement of TSV manufacturing yield is too high (normally greater than 99.99%) for the TSV components in order to justify the addition of costs due to the TSV yield loss.

For the reasons discussed above, low-cost and effective thermal management solutions are highly desired for widespread use of high-performance 3D IC integration devices.

BRIEF SUMMARY OF THE INVENTION

This specification describes a three-dimensional integrated circuit (3D IC) structure for high-performance and low-cost circuit integrations with improved thermal management.

According to some embodiments, the 3D IC structure includes an interposer with a plurality of through silicon vias (TSVs). The interposer acts as a supporting structure to which one or more bare high-power chips and one or more low power chips are attached. Specifically, the high-power chips are flip-chip bumped on the top-side of the TSV interposer wafer. The back sides of these high-power chips are attached to a heat spreader. A thermal interface material (TIM) is used at the interface between the high-power chips and the heat spreader, in order to achieve optimal thermal performance. A heat sink is further attached to the heat spreader to provide additional cooling.

The low-power chips are either wire-bound or flip-chip bumped onto the bottom-side of the TSV interposer in order to achieve optimal electrical performance. In addition, during the fabrication process, the heat spreader wafer is used as a supporting carrier for assembling the low-power chips at the bottom-side of the TSV interposer.

Unlike conventional 3D IC integrations where the TSVs must be made in an active circuit element for interconnecting the stacked chips, the interposer here does not include any active circuit elements, and therefore the TSVs can be easily made into the interposer, thereby reducing the fabrication cost. In addition, because the high-power chips, which require more intensive cooling than the lower power chips, are placed on the top surface of the interposer and attached to the heat spreader, the cooling of the integration is improved, thereby improving the thermal management and heat dissipation.

Furthermore, the 3D IC integration (including the TSV interposer and the high and low-power chips) in bare chip form is supported on a simple organic substrate of a standard face-down plastic ball grid array (PBGA) package. A ring stiffener is disposed between the organic substrate and the heat sink to provide adequate standoff for the 3D IC integration. This 3D In some alternative embodiments, the heat sink and the ring stiffener are not installed, when the high-power chips does not generate significant amount of heat.

The 3D IC structural design described herein offers an ideal solution for high-power, high-performance, high-reliability, low-cost, low-profile, and small foot-print applications.

BRIEF DESCRIPTION OF THE SEVERAL VIEWS OF THE DRAWINGS

FIGS. 6A and 6B depict the solder bumps disposed on the high and low-power chips shown in FIG. 5; and FIGS. 7A and 7B depicts the 3D IC apparatus shown in FIG. 5 when it is assembled on a PCB.

DETAILED DESCRIPTION OF THE INVENTION

In order to achieve the objectives described above, the 3D IC integration structure utilizes a TSV interposer for providing chip-to-chip interconnections. As described in various embodiments below with reference to the drawings, the structure can be integrated into a 3D System-in-Package (SiP) format to provide improved thermal management.

Figure 1:
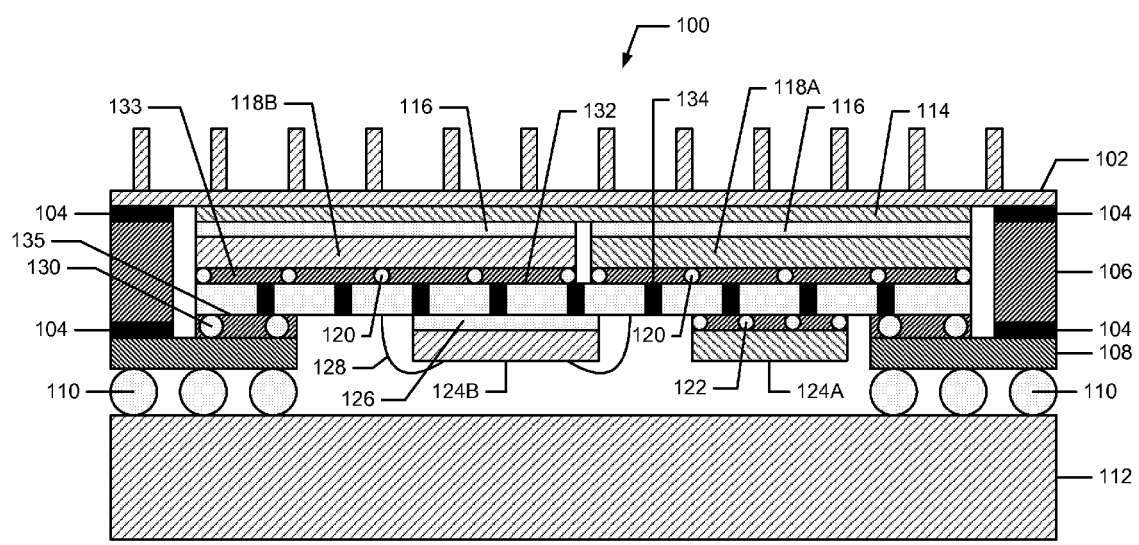
FIG. 1 depicts one embodiment of the three-dimensional integrated circuit integration structure with improved-thermal management.

Now turning to FIG. 1, depicted therein is 3D IC apparatus 100 including interposer 132 for supporting high-power chips 118A and 118B and low-power chips 124A and 124B. The apparatus 100 includes a standard face-down PBGA package attached printed circuit board 112.

In particular, the interposer 132 includes high-density TSVs 134 and redistribution layers to connect the high-power chips 118A and 118B and low-power chips 124A and 124B. The interposer 132 provides signal redistributions among the high and low-power chips. The interposer 132 has conductive metal pads of different sizes and at different locations on its top and bottom surface to provide electronic connections to the chips. The TSVs 134 are vertical electrical connections passing completely through the silicon interposer 132. In additional, the interposer 132 is a silicon wafer with no active circuit elements, and it is therefore much easier and more cost effective to fabricate than most 3D IC structure where TSVs must be created in an active chip such as a memory chip or a digital processor chip. Additional chip manufacturing cost due to TSV yield-loss can be avoided.

The interposer 132 with TSVs 134 can be fabricated using a technique similar to those detailed in the following literatures:

Zhang et al., "Development of Through Silicon Via (TSV) interposer technology for large die (21×21 mm) fine-pitch Cu/low-k FCBGA packet," in Proceedings of 59$^{th}$ Electronic Components and Technology Conference, pp. 305-312, 2009;

Yu et al., "Three dimensional interconnects with high aspect ratio TSVs and fine pitch solder microbumps," in Proceedings of 59$^{th}$ Electronic Components and Technology Conference, pp. 350-354;

Selvanayagam et al., "Nonlinear thermal stress/strain analyses of copper filled TSV (through silicon via) and their flip-chip microbumps," IEEE Transactions on Advanced Packaging, Vol. 32, No. 4, pp. 720-728, November 2009;and Yu et al., "Fabrication of silicon carriers with TSV electrical interconnections and embedded thermal solutions for high power 3-D packages," IEEE Transactions on Components and Packaging Technologies, Vol. 32, No. 3, pp. 556-571, September 2009 which are herein incorporated by reference in their entireties and for everything they include therein.

As further shown in FIG. 1, all of the high-power chips 118A and 118B are attached and connected to the top surface of the TSV interposer 132 in a flip-chip format through micro-bumps 120. The back sides of these high power chips can be attached to a heat spreader 114 via a thermal interface material (TIM). In order to provide further cooling for the high power chips, heat sink 102 is attached to the back of the heat spreader 114. In this embodiment, most of the heat from the high-power chips is dissipated through the heat spreader 114 and the heat sink 102 into the external environment.

Figure 3:
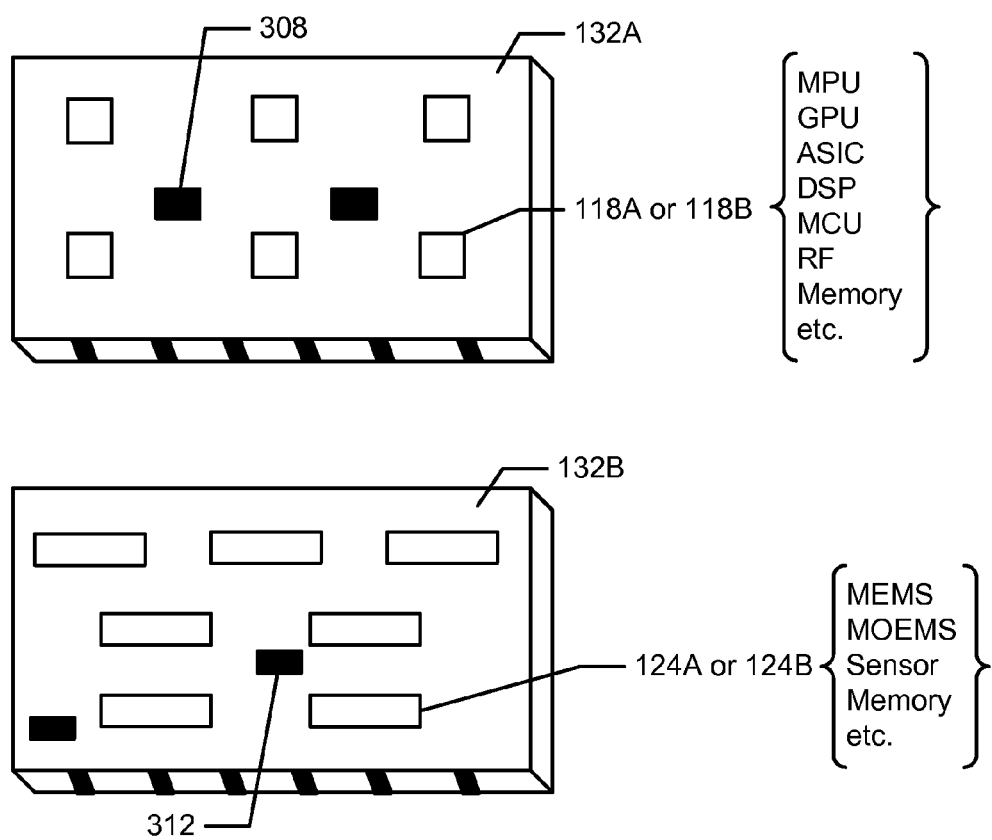
FIG. 3 depicts a representative drawing of the TSV interposer with various IC chips attached thereon.

As shown in FIG. 3, the high power chips 118A and 118B can provide a number of functions including but not limited to Micro-Processor Unit (MPU), Graph-Processor Unit (GPU), Application Specific IC (ASIC), Digital Signal Processor (DSP), Micro-Controller Unit (MCU), Radio Frequency (RF) transceiver, and high-power memory chips.

On the other hand, all of the low-power chips 124A and 124B are attached and connected to the bottom surface of the TSV interposer 132. As depicted in FIG. 1, the low-power chip can be connected to the interposer 132 in either flip-chip or wire-bond format. For example, the low-power chip 124A is attached and connected to the interposer 132 in the flip-chip format through micro-bump 122, while the low-power chip 124B is connected to the interposer 132 in the wire-bond format through wire 128 and attached to the interposer surface by a die attach material 126.

The low-power chips can provide various functions including but not limited to the Micro-Electromechanical System (MEMS), Micro-Optoelectromechanical System (MOEMS), Complementary Metal Oxide Semiconductor (CMOS) image sensors, and memory chips, as shown schematically in FIG. 7.

In general, when the device 100 is in operation mode, the high-power chips 118A and 118B generate more heat than do the low-power chips 124A and 124B. The low-power chip 124A and 124B does not require special cooling, and is therefore able to operate properly even when it is not attached to the heat spreader.

Furthermore, because the interposer 132, the high-power chips 118A and 118B, and the lower-power chips 124A and 124B have different thermal expansion coefficients, they expand or contract by different amounts when the device 100 is heated or cooled due to the heat generated during the operations, thereby creating a relative motion between the chips and the interposer. In order to prevent the micro-bumps 120 and 122 from being loosened by the relative motion between the chips (118A, 118B, 124A, and 124B) and the interposer 132, underfill material 133, as well known in the art, is used to filled in the gaps between the chips and the interposer so that the micro-bump connections are secured.

As further shown in FIG. 1, the TSV interposer assembly is attached to substrate layer 108 through solder balls 130, which is in turn attached to printed circuit board (PCB) 112 through solder balls 110. The substrate 108, which can take the form of bismaleimide triazine (BT) substrate, may includes vias or conductive wires for providing electronic interconnects between the interposer assembly and the PCB 112. In order to provide additional support, ring stiffener 106 is disposed and attached between the substrate 108 and the heat sink 102 through adhesive layers 104.

Similar to the underfill 133 between the chips and the interposer, underfill material 155 is used to filled the gaps between the interposer 132 and the substrate layer 108 to secure the solder ball connections.

Figure 2:
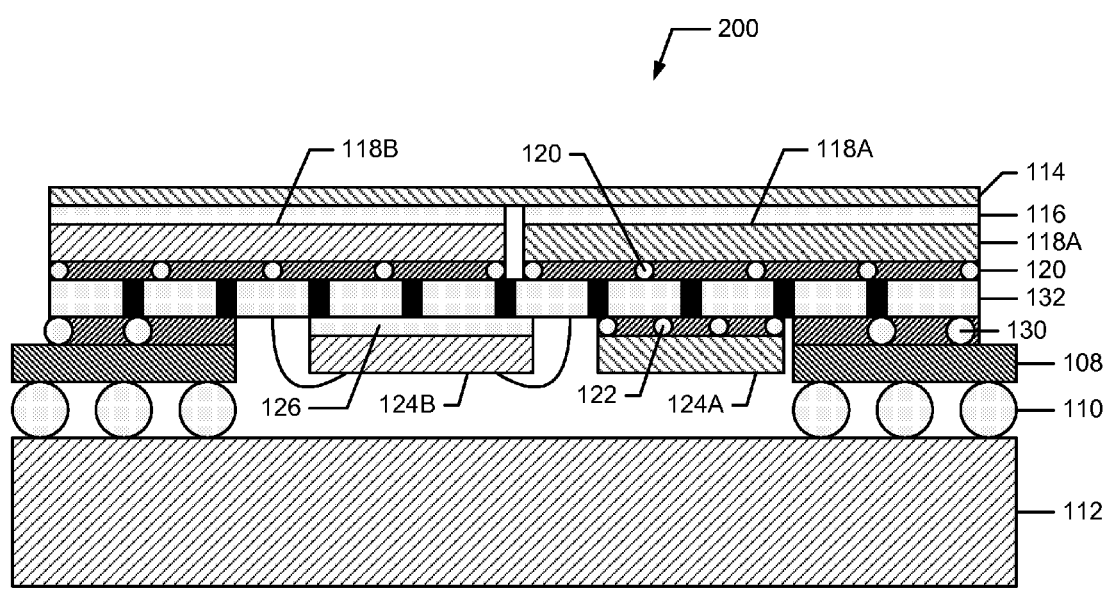
FIG. 2 depicts another embodiment of the three-dimensional integrated circuit integration structure with improved-thermal management.

However, underfill is not needed between the TSV interposer assembly and the PCB 112. For wirebonded chips such as chip 124B, a glob top encapsulant may or may not be required to enclose the chip As depicted in FIG. 2, if there is only one or two high-power chips 118A and 118B on the top of the TSV interposer and a few low-power chips underneath, then the heat sink 102 is not required. In this embodiment, the stiffener 106 is not necessary and the foot-print of the apparatus 200 is even smaller than that of the apparatus 100.

FIG. 3 depicts a view of top surface 132A of the interposer 132, which can accommodate a number of high power chips 118A and 118B as well as passive devices 308 such as capacitor or resistors. Similarly, bottom surface 132B of the interposer 132 can include a number of low-power chip 124A and 124B as well as passive devices 312.

FIGS. 4A-4F depicts a number of alternative embodiments of apparatuses 100 and 200. Each of these figures depicts a top and bottom views of a TSV interposer, which is similar to those shown in FIGS. 1 and 2.

Figure 4A:
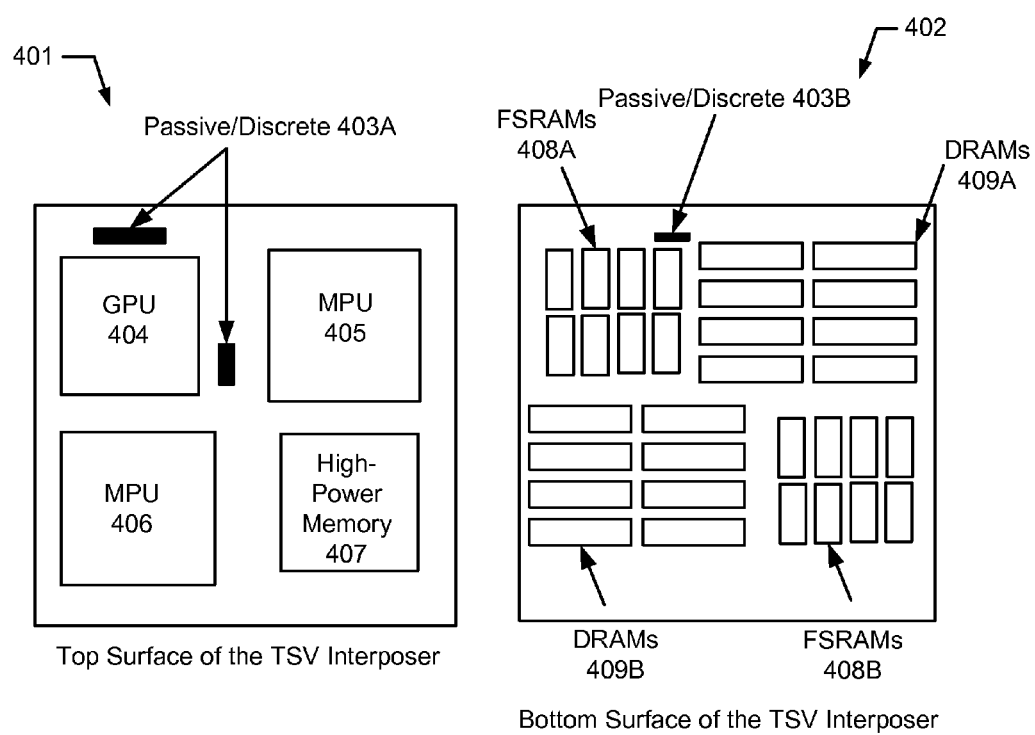
FIG. 4A-4F depicts various implementations of the TSV interposer for improved-thermal management.

Specifically, FIG. 4A depicts an exemplary embodiment of a very high-performance application, including one or more MPUs 405 and 406, one or more GPUs 404, and high-power memory chips 407. These high-power chip are flip-chip bumped (with any geometric configuration and material make-up) onto the top surface 401 of the TSV interposer. The back sides of these chips are attached to a heat spreader and/or a heat sink through the thermal interface material. Most of the heat from these chips is dissipated through the heat spreader/sink.

On the other hand, the low-power memory chips, including mostly memory chips such as fast static random access memories (FSRAMs) 408A and 408B and dynamic random access memories (DRAMs) 409A and 409B, are attached either by wire bonding or flip-chip bumping to the bottom surface 402 of the TSV interposer. The interposer may also include passive devices 403A and 403B on the top and bottom surfaces.

In this embodiment, the TSV interposer has an effective thermal coefficient of expansion (TCE) approximately equal to $10 \times 10^{-6}/°$ C., the high-power chips's TCE is approximately $2 \times 10^{-6}/°$ C., the low-power chips's TCE is approximately $2 \times 10^{-6}/°$ C., and the organic substrate's TCE is approximately $18 \times 10^{-6}/°$ C. In order to ensure the thermal-mechanical reliability of the bump interconnects, underfills are needed between the interposer and the chips and between the interposer and the substrate.

Figure 4B:
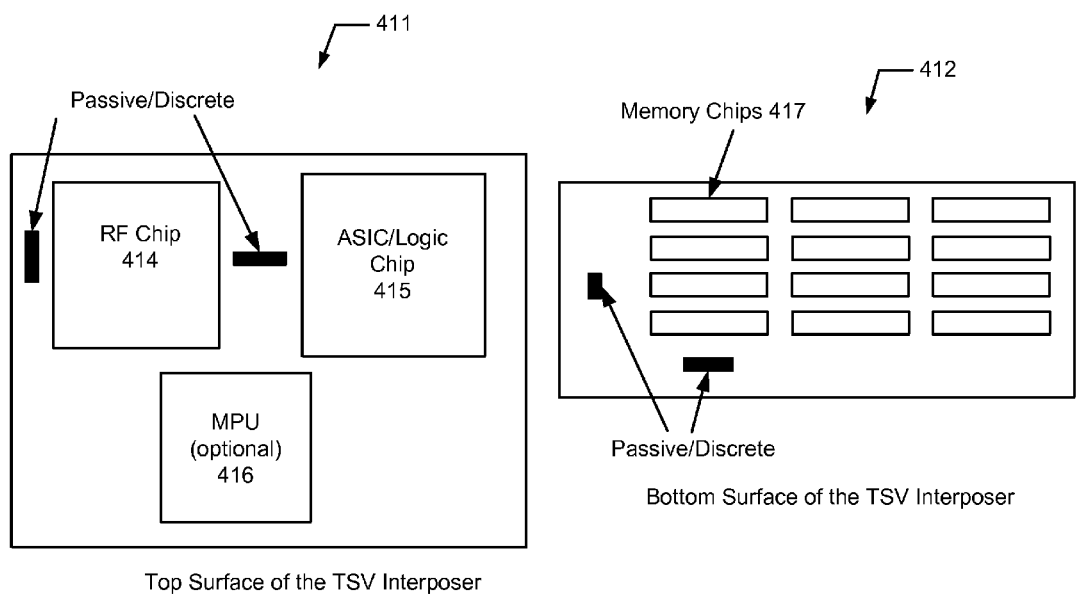

FIG. 4B depicts an embodiment for a radio frequency (RF) chip set application, including an RF chip 414, an ASIC chip 415, an MPU 416 which his optional, and some memory chips 417. Again, all the high-power chips are flip-chip bumped on the top surface 411 of the TSV interposer, and the low-power chips such as the memories are also flip-chip bumped on the bottom surface 412 of the TSV interposer. Also, the heat spreader and/or heat sink is attached to the backside of the RF and ASIC chips to dissipate the heat which they produce during their operations.

Figure 4C:
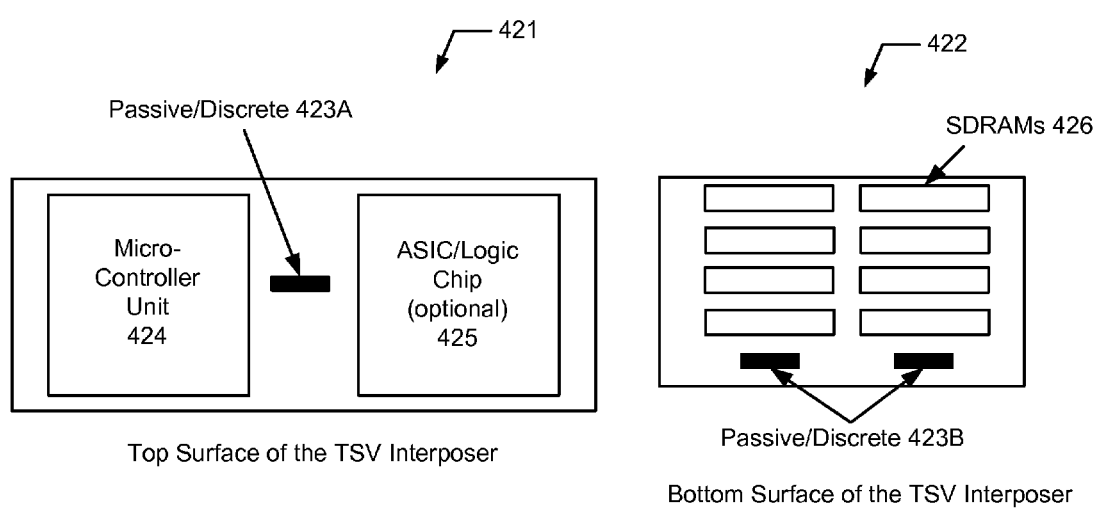

FIG. 4C depicts an embodiment for a microcontroller chip set application, including micro-controller unit (MCU) 424, static dynamic random access memories (SDRAMs) 426, and ASIC chip 425, which is optional. In this embodiment, both the MCU 424 and the ASIC chip 425 are flip-chip bumped onto the top surface 421 of the TSV interposer and their back sides are attached to a heat spreader and/or a heat sink. The SDRAMs 426 are flip-chip bumped to the bottom surface 422 of the TSV interposer. Again, underfills are needed to ensure the reliability of the bumped interconnects.

Figure 4D:
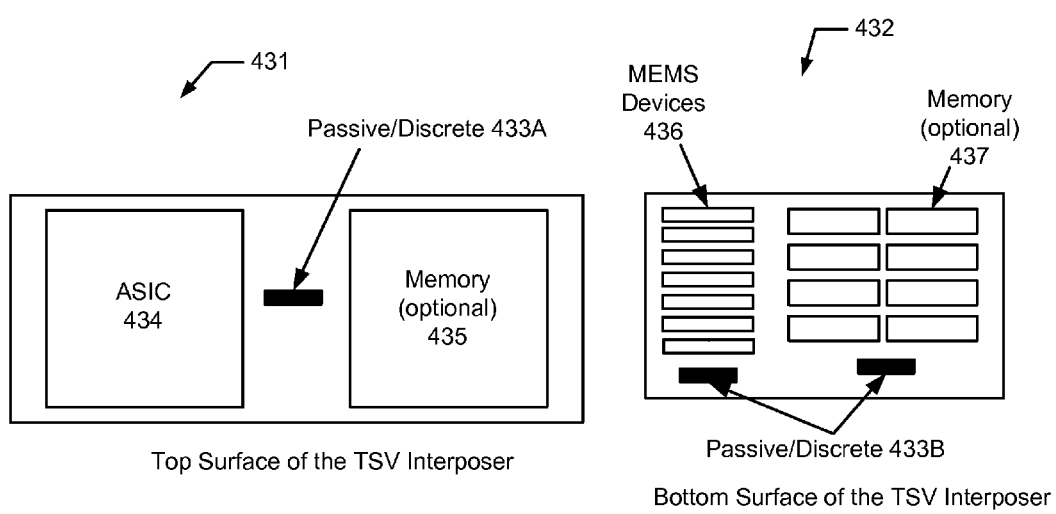

FIG. 4D shows an embodiment for a 3D MEMS/ASIC chip set application, including Micro-Electromechanical System (MEMS) devices 436 attached either by wire bonding or flip-chip bumping to the bottom surface 432 of the TSV interposer. If necessary, low-power memory chips 437 can also be flip-chip bumped to the bottom surface 432. The ASIC 434 and possibly some high-power memory chips 435 are flip-chip bumped on the top surface 431 of the TSV interposer. Again, the heat from the high-power chips is dissipated through the attached heat spreader and/or heat sink. Also, underfills are needed to secure the electronic connections. Furthermore, for wire-bond connections, glob top enacpsulants may be needed.

Figure 4E:
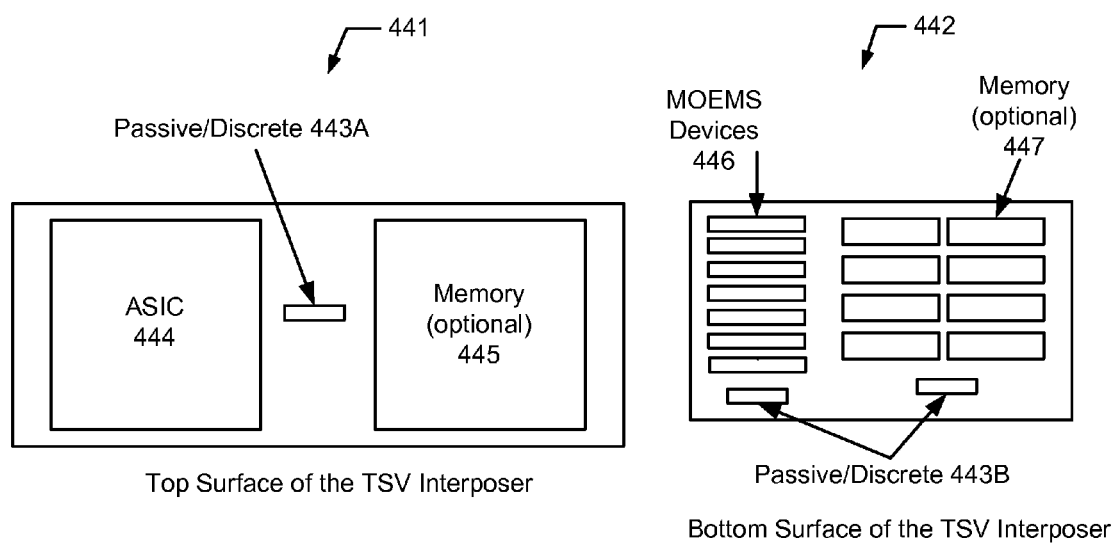

FIG. 4E depicts an embodiment for a Micro-Optoelectromechanical System (MOEMS) application. This embodiment is similar to that shown in FIG. 4E, except that the MOEMS devices 446 are wire-bonded to the bottom surface 442 of the TSV interposer. In addition, tiny holes (or cut-outs) are disposed in the PCB 112 and aligned with the light emitter on the MOEMS devices 446 for light to shine through.

Figure 4F:
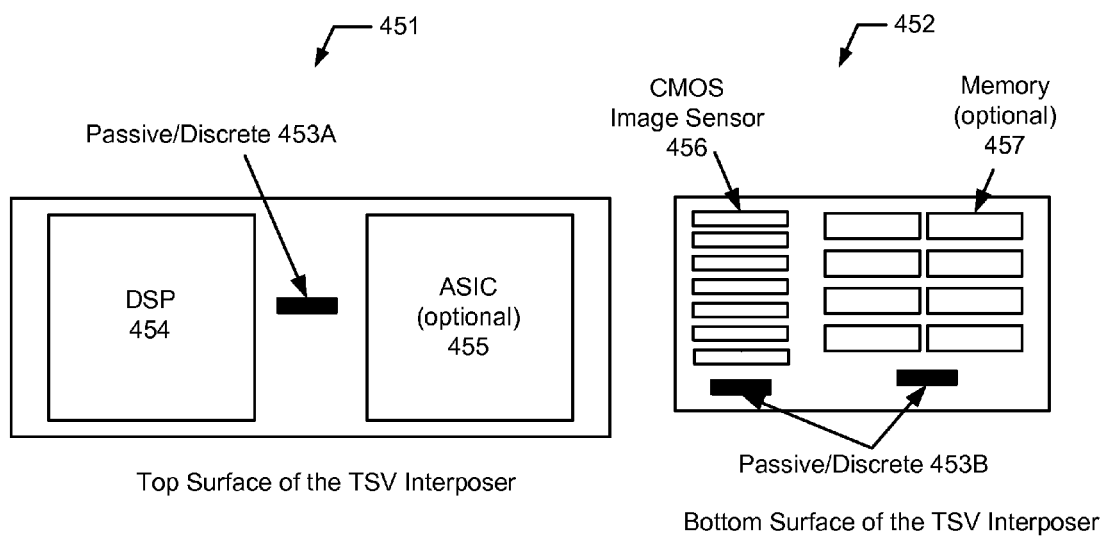

FIG. 4F depicts an embodiment for an application of Digital Signal Processors (DSP) and CMOS image sensors. According to this embodiment, the DSP 454 and optional logic chips 455 are flip-chip bumped on the top surface 451 of the TSV interposer, and the CMOS image sensors 456 and memory chips 457 are wire bonded to the bottom surface 452 of the TSV interposer. Again, underfills are necessary and tiny holes (or cut-outs) are disposed in the PCB 112 for light to shine through.

As further depicted in FIGS. 4A-F, additional passive devices can be attached to the top and bottom surfaces of the interposer.

Figure 5:
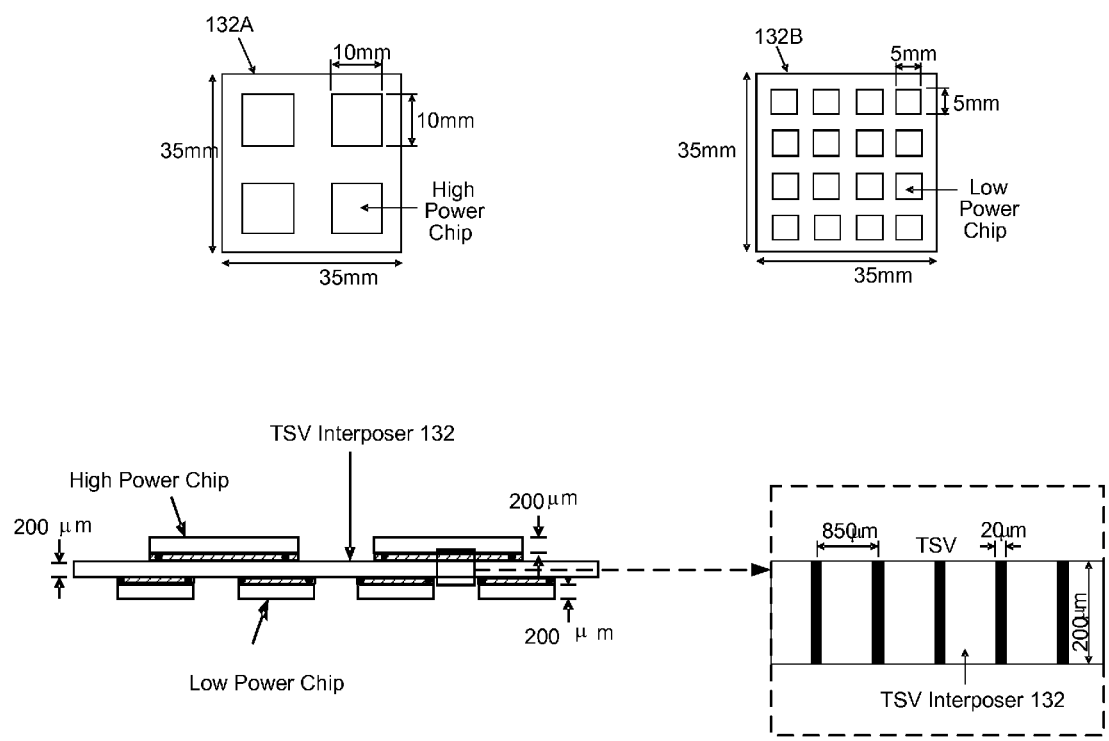
FIG. 5 depicts one embodiment of the 3D IC apparatus having four high-power chips on top of the interposer and 16 low-power chips attached to the bottom of the interposer.

FIGS. 5-7 depict a further embodiment of the 3D IC apparatus 100. As shown in FIG. 5, the interposer 132 is a 35×35 mm silicon wafer with a thickness substantially equal to 200 μm. The interposer 132 includes a total of 1600 TSVs evenly distributed in the interposer 132 in a regular grid. Each TSV is made from a cylindrical hole, with a diameter substantially equal to 20 μm, drilled through the silicon substrate and filled with a conductive material such as cooper. The distance between adjacent TSV is substantially equal to 850 μm.

On the top surface 132A of the interposer, four high-power chips are attached and distributed uniformly. Each high-power chip has a size of 10 mm in length and width and 200 μm in thickness. As described above, each high-power chip is flip-chip bumped onto the interposer through solder bumps disposed along the edges of the chip, with 66 solder bumps along each edge (FIG. 6A). The distance between adjacent solder bumps is substantially equal to 150 μm. The high-power chips can provide various functionalities as discussed above with respect to FIGS. 4A-F.

On the bottom surface 132B of the interposer, a total of 16 low-power chips are similarly attached and distributed uniformly. Each low-power chip has a size of 5 mm in length and width and 200 μm in thickness. Each low-power chip is flip-chip bumped or wire boned onto the interposer. For flip-chip bumped low-power chips, solder bumps are disposed along the edges of the chip, with 11 solder bumps along each edge (FIG. 6B). The distance between adjacent solder bumps is substantially equal to 400 μm. The high-power chips can provide various functionalities as discussed above with respect to FIGS. 4A-F.

Figure 7B:
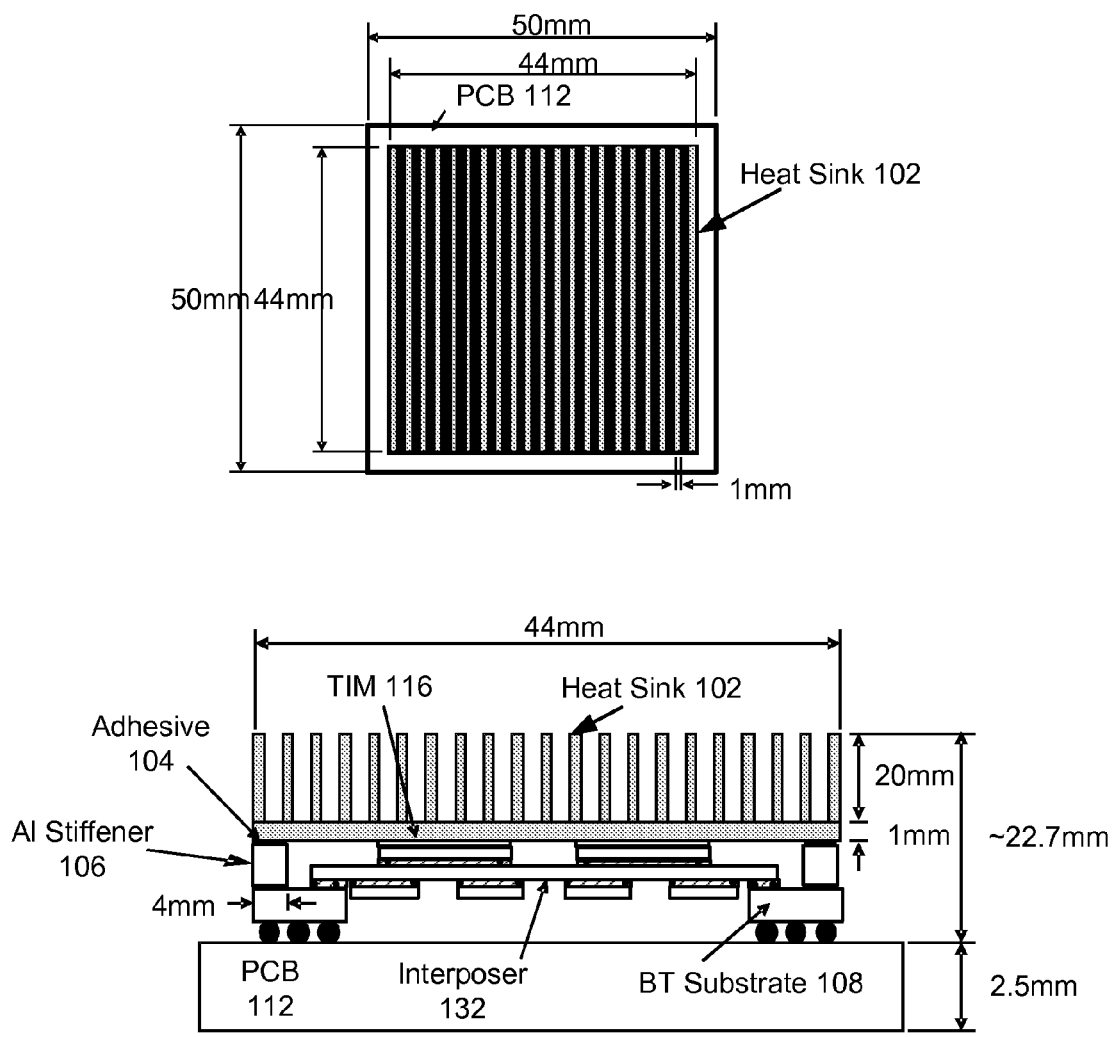

FIGS. 7A-B depict the various views of the entire 3D IC assembly sitting on top of a PCB. Specifically, 7A depicts the top and side views of the 3D IC apparatus without the heat sink and ring stiffener. The interposer 132 carrying the high and low-power chips is attached to the BT substrate 108 through 100 μm solder balls 130. The substrate 108 is in turn attached to the PCT 112 through 300 μm solder balls 110. The PCB 112 has a size of 50 mm in length and width and 2.5 mm in thickness, and the BT substrate 108 has a size of 44 mm in length and width and 0.8 mm in thickness. The distance between adjacent solder balls 130 is substantially equal to 0.5 mm, and that between adjacent solder balls 110 is substantially equal to 1.5 mm.

FIG. 7B depicts the top and side views of the 3D IC apparatus with the heat sink and ring stiffener. Specifically, the heat sink 102 is made of aluminum and has length and width substantially equal to those of the substrate 108. The top surface of the heat sink 102 has 21 fins uniformly distributed along one direction. Each fins, extending between two opposite edges of the heat sink, is 1 mm in thickness and 20 mm in height. The distance between adjacent fins is substantially equal to 1 mm. The bottom surface of the heat sink 102 is attached to the top surfaces of the high-powers through thermal interface material layer 116, which has a thickness substantially equal to 100 μm.

The ring stiffener 106, which is made of aluminum or other materials, has a shape that matches the heat sink 102 and the substrate 108. The wall of the stiffener 106 has a thickness substantially equal to 4 mm. The ring stiffener 106 is attached between the substrate 108 and the heat sink 102 through adhesive layers 104. The entire 3D IC assembly is substantially equal to 22.7 mm in height.

After reading various embodiments, one skilled in the art will also appreciate that the interfaces between each two connected chips may have an under bump metallugy (UBM) layer for providing reliable electrical connections with the solder bumps that connect the chips. For example, each of the upper and lower surfaces of the interposer includes a micro UBM layer aligned with the micro bumps that connect the high and lowe power chips. Similarly, the surfaces of the high and lower power chips that connects to the interposer may also include micro UBM layers. In addition, the sufaces of the substrate layer may also include UBM layers for connecting with the solder bumps on the interposers and the solder balls on the PCB.

The 3D IC apparatus described above is particularly suitable for Original Equipment Manufacturing (OEM) and Electronics Manufacturing Services (EMS) implementations. Its standard face-down PBGA package can be easily adapted for known fabrication methods. In particular, the fabrication process includes first disposing the UBM layers onto both first and second surfaces of the interposer wafer with the Through Silicon Vias (TSVs) and flip-chip bumping the bare high-power chips on the first surface of the interposer wafer. On the other side of these high-power chips, a heat spreader wafer is attached to them by applying a thermal interface material (TIM). In the next step, the heat spreader wafer is used as a supporting carrier for assembling of the low-power chips at the other side of the TSV interposer. The low-power chips are either wire bonded or flip-chip bumped to the second surface of the interposer. In still the next step, the complete 3D bare IC integration is supported and attached onto a simple organic substrate in a standard face-down PBGA package so that the lower power chips are oriented toward the substrate layer. Additionally, if necessary, a heat sink is disposed on the heat spreader and connected with the organic substrate through a ring stiffener to provide adequate standoff for the 3D IC integration.

The various embodiments described herein provide effective thermal management and reliable connections through solder joints. In conjunction with the proper design of the high and low-power chips inside the package, it provides both cost-effective and high electrical and thermal-performance applications.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An integrated circuit structure, comprising:
one or more high power integrated circuit (IC) chips in bare chip form;
one or more low power IC chips in bare chip form, wherein each high power IC chip generates more heat than each low power IC chip;
an interposer having a plurality of through silicon vias and having one or more redistribution layers, wherein a first surface of the interposer is connected to the one or more high power IC chips and a second surface of the interposer is connected to the one or more low power IC chips, the interposer providing wafer-level electronic interconnects between the one or more high power IC chips and the one or more low power IC chips;
a heat spreader attached to the one or more high power IC chips for dissipating heat from the one or more high power IC chips; and
a substrate layer attached to the second surface of the interposer for supporting the interposer and providing electronic interconnects between the interposer and a printed circuit board.

2. The structure of claim 1, further comprising:
a heat sink attached to the heat spreader for providing additional cooling to the one or more high-power IC chips; and
a stiffener inserted between the heat sink and the substrate for supporting the heat sink.

3. The structure of claim 1, wherein each of the one or more high power IC chips is attached and connected to the first surface of the interposer through a front surface of the high power IC chip according to a flip-chip method, and
wherein the heat spreader is attach to a back surface of the high power IC chip through a thermal interface layer.

4. The structure of claim 1, wherein the substrate layer has an internal opening aligned with the one or more low power IC chips.

5. The structure of claim 2, wherein each of the heat sink and the substrate layer has a horizontal dimension larger than those of the interposer and the heat spreader so that the heat sink, the substrate layer, and the stiffener forms an enclosed space enclosing the interposer, the one or more high power IC chips, the one or more low power IC chips, and the heat spreader.

6. The structure of claim 1, wherein at least one of the one or more low power IC chips is attached and connected to the second surface of the interposer through a front surface of the at least one low power IC chip according to a flip-chip method.

7. The structure of claim 1, wherein at least one of the one or more low power IC chips is attached to the second surface of the interposer through a die attach layer and connected to the second surface of the interposer through wire bonds.

8. The structure of claim 1, wherein the substrate layer is attached to the second surface of the interposer through a plurality of solder bumps.

9. The structure of claim 1, wherein the substrate layer is attached to the PCB board through a plurality of solder balls.

10. The structure of claim 1, wherein the substrate layer has an internal opening aligned with the one or more low power IC chips and the substrate layer has a vertical dimension larger than those of the one or more low power IC chips so that the one or more low power IC chips are lifted away from the printed circuit board.

11. The structure of claim 1, wherein the one or more high power IC chips include at least one of a graphic processing unit, an audio processing unit, a high power memory chip, a radio frequency chip, an ASIC logic chip, a micro-controller unit, and a digital signal processing chip.

12. The structure of claim 1, wherein the one or more low power IC chips include a memory module.

13. A method for fabricating an integrated circuit structure, comprising:
providing one or more high power integrated circuit IC chips in bare chip form;
providing one or more low power IC chips in bare chip form, wherein each high power IC chip generates more heat than each low power IC chip;
forming an interposer having a plurality of through silicon vias and having one or more redistribution layers, wherein a first surface of the interposer is connected to the one or more high power IC chips and a second surface of the interposer is connected to the one or more low power IC chips, the interposer providing wafer-level electronic interconnects between the one or more high power IC chips and the one or more low power IC chips;
forming a heat spreader attached to the one or more high power IC chips for dissipating heat from the one or more high power IC chips; and
forming a substrate layer attached to the second surface of the interposer for supporting the interposer and providing electronic interconnects between the interposer and a printed circuit board.

* * * * *

UNITED STATES PATENT AND TRADEMARK OFFICE
CERTIFICATE OF CORRECTION

| | | |
|---|---|---|
| PATENT NO. | : 8,604,603 B2 | Page 1 of 1 |
| APPLICATION NO. | : 12/709291 | |
| DATED | : December 10, 2013 | |
| INVENTOR(S) | : Lau et al. | |

It is certified that error appears in the above-identified patent and that said Letters Patent is hereby corrected as shown below:

Title page, Abstract, line 2, "include an" should read -- includes an --.

Title page, Abstract, line 6, "In generally," should read -- In general, --.

Title page, Abstract, line 8, "further include" should read -- further includes --.

Title page, Abstract, line 13, "improve" should read -- improved --.

Title page, Abstract, line 14, "are orientated" should read -- is oriented --.

Signed and Sealed this
Thirteenth Day of May, 2014

Michelle K. Lee
*Deputy Director of the United States Patent and Trademark Office*